(12) United States Patent
Wu et al.

(10) Patent No.: US 10,468,355 B2
(45) Date of Patent: Nov. 5, 2019

(54) EMI SHIELDING STRUCTURE IN INFO PACKAGE

(71) Applicant: Taiwan Semiconductor Manufacturing Company, Ltd., Hsinchu (TW)

(72) Inventors: Kai-Chiang Wu, Hsinchu (TW); Chen-Hua Yu, Hsinchu (TW); Ching-Feng Yang, Taipei (TW); Meng-Tse Chen, Changzhi Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 29 days.

(21) Appl. No.: 15/966,691

(22) Filed: Apr. 30, 2018

(65) Prior Publication Data
US 2019/0181096 A1    Jun. 13, 2019

Related U.S. Application Data

(60) Provisional application No. 62/596,393, filed on Dec. 8, 2017.

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/288* (2013.01); *H01L 21/31053* (2013.01);
(Continued)

(58) Field of Classification Search
CPC ............... H01L 23/552; H01L 23/3128; H01L 23/5384; H01L 23/5386; H01L 23/5389; H01L 23/66; H01L 21/288; H01L 21/31053; H01L 21/32051; H01L 21/561; H01L 21/568; H01L 21/6835; H01L 21/76885; H01L 21/78; H01L 24/19; H01L 24/20; H01L 24/96; H01L 25/105; H01L 2221/68359; H01L 2223/6616; H01L 2223/6677; H01L 2224/211;
(Continued)

(56) References Cited

U.S. PATENT DOCUMENTS 9,007,273 B2    4/2015    Liao et al.
9,922,939 B2    3/2018    Chen et al.
(Continued)

FOREIGN PATENT DOCUMENTS

TW    201214652 A    4/2012
TW    201724387 A    7/2017

*Primary Examiner* — Yosef Gebreyesus
(74) *Attorney, Agent, or Firm* — Slater Matsil, LLP

(57) ABSTRACT

A method includes forming a metal post over a first dielectric layer, attaching a second dielectric layer over the first dielectric layer, encapsulating a device die, the second dielectric layer, a shielding structure, and the metal post in an encapsulating material, planarizing the encapsulating material to reveal the device die, the shielding structure, and the metal post, and forming an antenna electrically coupling to the device die. The antenna has a portion vertically aligned to a portion of the device die.

20 Claims, 29 Drawing Sheets

(51) Int. Cl.
  *H01L 21/3105* (2006.01)
  *H01L 23/66* (2006.01)
  *H01L 21/3205* (2006.01)
  *H01L 21/288* (2006.01)
  *H01L 23/00* (2006.01)
  *H01L 23/538* (2006.01)
  *H01L 23/31* (2006.01)
  *H01L 21/683* (2006.01)
  *H01L 21/768* (2006.01)
  *H01L 25/10* (2006.01)
  *H01L 21/78* (2006.01)

(52) U.S. Cl.
  CPC ...... *H01L 21/32051* (2013.01); *H01L 21/561* (2013.01); *H01L 21/568* (2013.01); *H01L 21/6835* (2013.01); *H01L 21/76885* (2013.01); *H01L 23/3128* (2013.01); *H01L 23/5384* (2013.01); *H01L 23/5386* (2013.01); *H01L 23/5389* (2013.01); *H01L 23/66* (2013.01); *H01L 24/19* (2013.01); *H01L 24/20* (2013.01); *H01L 24/96* (2013.01); *H01L 21/78* (2013.01); *H01L 25/105* (2013.01); *H01L 2221/68359* (2013.01); *H01L 2223/6616* (2013.01); *H01L 2223/6677* (2013.01); *H01L 2224/211* (2013.01); *H01L 2225/1023* (2013.01); *H01L 2225/1041* (2013.01); *H01L 2225/1058* (2013.01); *H01L 2924/3025* (2013.01)

(58) Field of Classification Search
  CPC ..... H01L 2225/1023; H01L 2225/1041; H01L 2225/1058
  See application file for complete search history.

(56) References Cited

U.S. PATENT DOCUMENTS

| | | | |
|---|---|---|---|
| 2007/0200748 A1* | 8/2007 | Hoegerl | H01L 23/3128 342/85 |
| 2011/0127654 A1 | 6/2011 | Weng et al. | |
| 2013/0292808 A1* | 11/2013 | Yen | H01L 23/552 257/660 |
| 2016/0111376 A1 | 4/2016 | Seo et al. | |
| 2016/0240492 A1 | 8/2016 | Wolter et al. | |

* cited by examiner

EMI SHIELDING STRUCTURE IN INFO PACKAGE

PRIORITY CLAIM AND CROSS-REFERENCE

This application claims the benefit of the following provisionally filed U.S. Patent application: Application Ser. No. 62/596,393, filed Dec. 8, 2017, and entitled "Two-Tier Design for EMI Shielding in InFO Package;" which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, a device die is encapsulated in a molding compound, which is then planarized to expose the device die. Dielectric layers are formed over the device die. Redistribution lines are formed in the dielectric layers to connect to the device die. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
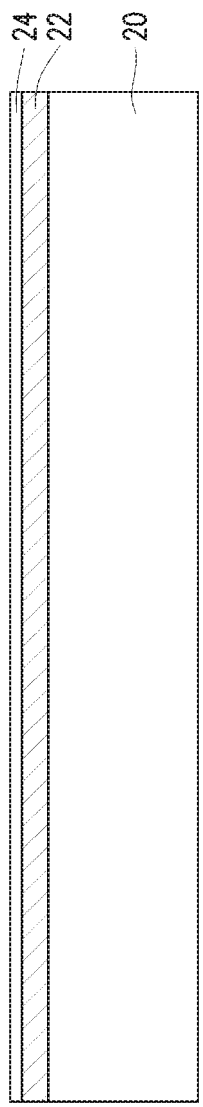
FIGS. 1 through 14 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various embodiments. The intermediate stages of forming the package are illustrated. Some variations of some embodiments are discussed. Throughout the various views and illustrative embodiments, like reference numbers are used to designate like elements.

Figure 29:
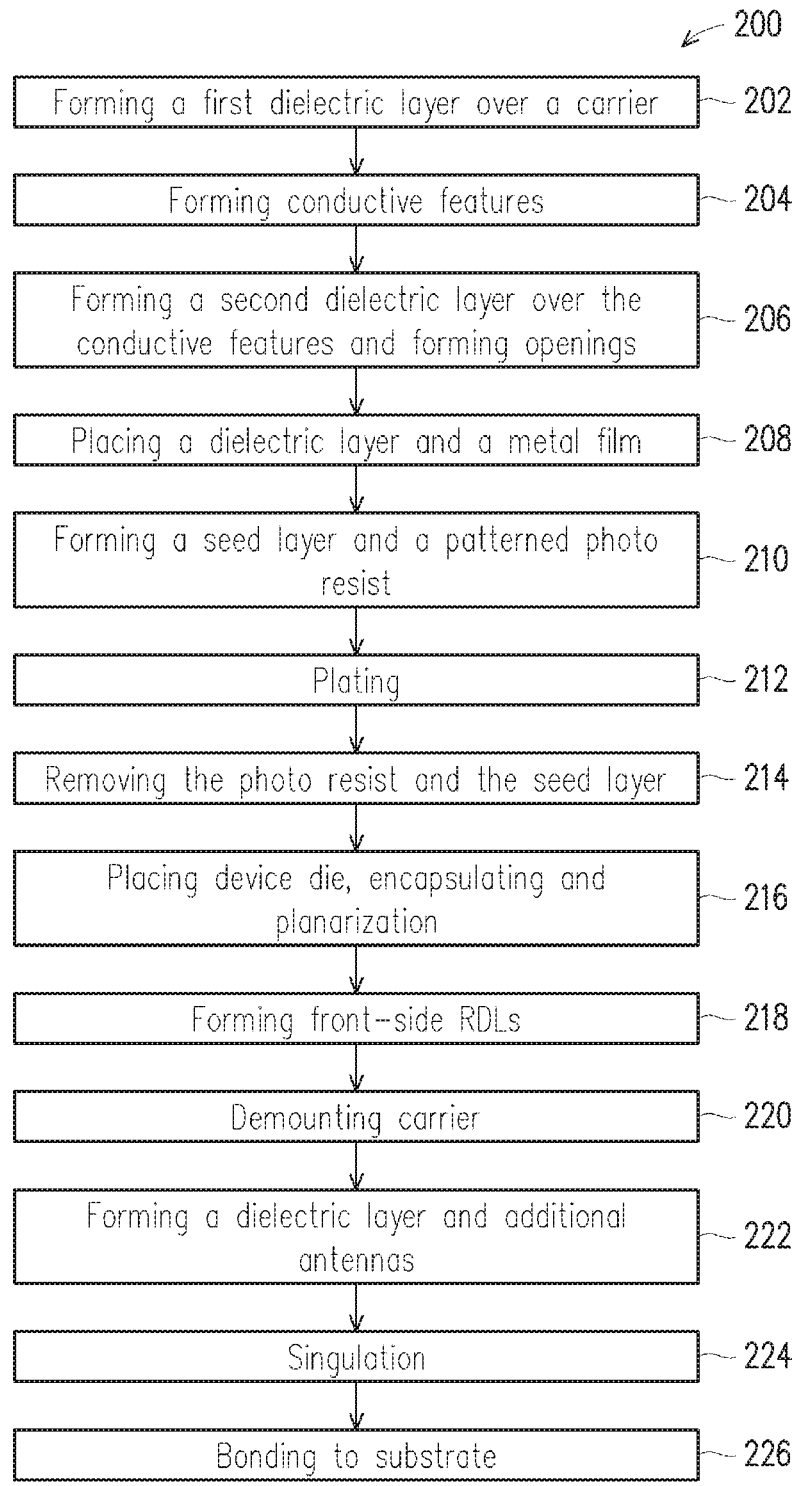
FIG. 29 illustrates a process flow for forming a package in accordance with some embodiments.

FIGS. 1 through 14 illustrate the cross-sectional views of intermediate stages in the formation a package in accordance with some embodiments. The steps shown in FIG. 1 through 14 are also illustrated schematically in the process flow 200 shown in FIG. 29.

FIG. 1 illustrates carrier 20 and release film 22 disposed on carrier 20. Carrier 20 may be a glass carrier, a ceramic carrier, or the like. Carrier 20 may have a round top-view shape and may have a size of a silicon wafer. Release film 22 may be formed of a polymer-based material (such as a Light-To-Heat-Conversion (LTHC) material), which may be removed along with carrier 20 from the overlying structures that will be formed in subsequent steps. In accordance with some embodiments of the present disclosure, release film 22 is formed of an epoxy-based thermal-release material. In other embodiments, release film 22 is formed of a ultraviolet (UV) glue. Release film 22 may be dispensed in a flowable form and then cured. The top surface of release film 22 is leveled and has a high degree of co-planarity.

Dielectric buffer layer 24 is formed on release film 22. The respective process is illustrated as process 202 in the process flow shown in FIG. 29. In accordance with some embodiments of the present disclosure, dielectric buffer layer 24 is formed of an organic material such as a polymer, which may also be a photo-sensitive material such as polybenzoxazole (PBO), polyimide, or the like, which may be patterned through light-exposure and development. In accordance with alternative embodiments of the present disclosure, dielectric buffer layer 24 is formed of an inorganic material, which may be a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
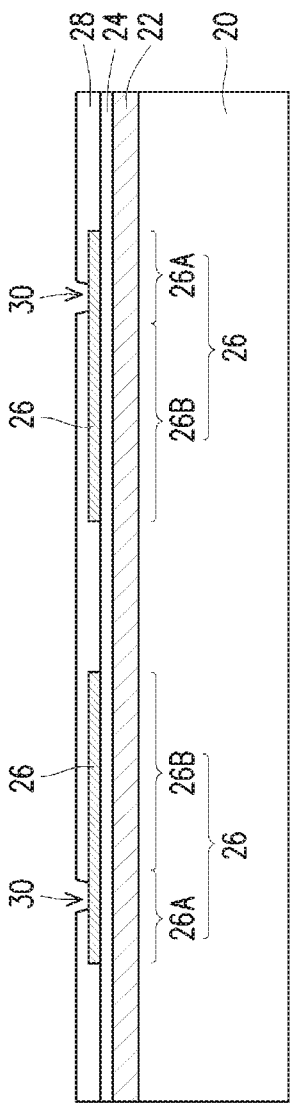
Figure 7:
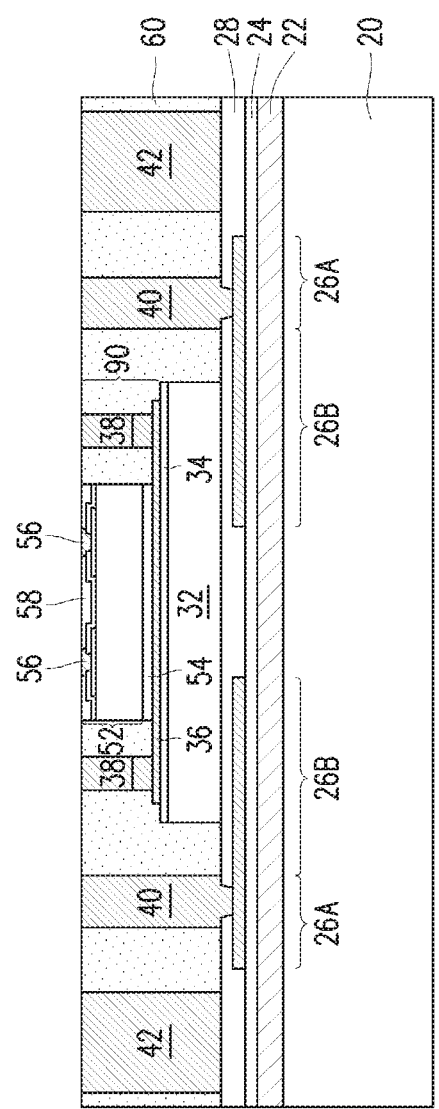

Referring to FIG. 2, conductive features 26 are formed over dielectric buffer layer 24. The respective process is illustrated as process 204 in the process flow shown in FIG. 29. Conductive features 26 may include Redistribution Lines (RDLs) 26A and metal pads 26B. Some of the metal pads 26B may act as a patch antenna. RDLs 26A are also referred to as backside RDLs since they are located on the backside of device die 52 (FIG. 7). The formation of RDLs 26 may include forming a metal seed layer (not shown) over dielectric buffer layer 24, forming a patterned mask (not shown) such as a photo resist over the metal seed layer, and then performing a metal plating on the exposed seed layer. The patterned mask is then removed, followed by the removal of the seed layer previously covered by the removed patterned mask, leaving RDLs 26 as in FIG. 2. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating, electro-chemical plating, or the like.

Further referring to FIG. 2, dielectric layer 28 is formed on conductive features 26. The respective process is illustrated as process 206 in the process flow shown in FIG. 29. The bottom surface of dielectric layer 28 is in contact with the top surfaces of conductive features 26 and dielectric buffer layer 24. In accordance with some embodiments of the present disclosure, dielectric layer 28 is formed of an organic material such as a polymer, which may be a photosensitive polymer such as PBO, polyimide, or the like. In accordance with alternative embodiments of the present disclosure, dielectric layer 28 is formed of an inorganic material, which may be a nitride such as silicon nitride, an oxide such as silicon oxide, PSG, BSG, BPSG, or the like. Dielectric layer 28 is then patterned to form openings 30 therein. Hence, some portions of conductive features 26 are exposed through openings 30 in dielectric layer 28.

Figure 3:
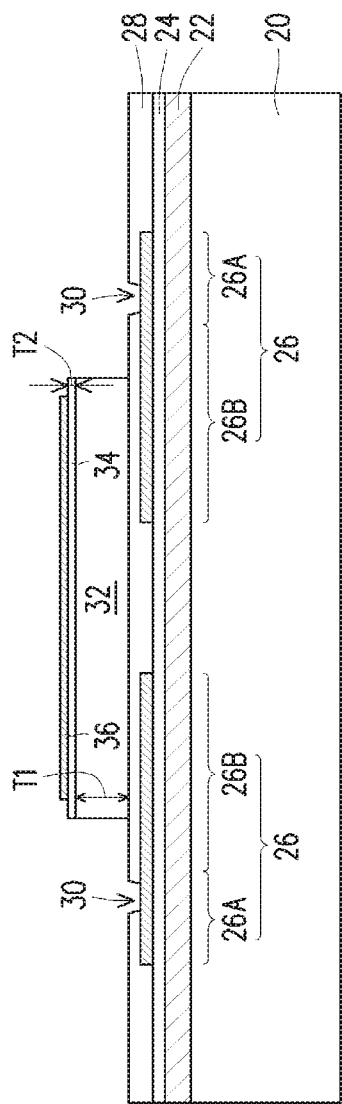

FIG. 3 illustrates the placement of dielectric layers 32 and 34, which are used for the isolation of Electro-Magnetic Interference (EMI), as will be discussed in subsequent paragraphs. The respective process is illustrated as process 208 in the process flow shown in FIG. 29. In accordance with some embodiments of the present disclosure, dielectric layer 32 is formed of an adhesive, which may be a Die-Attach Film (DAF) that can also be used for adhering device dies. With dielectric layer 32 being an adhesive film, dielectric layer 32 is able to adhere to dielectric layer 28. The thickness T1 of dielectric layer 32 is selected, so that the EMI between the subsequently formed patch antenna and the device die is lowered to an acceptable level. The thickness T1 may also be related to the dielectric constant (k value) of dielectric layer 32, and the greater the k value is, the greater thickness T2 is 1 preferred. For example, the thickness T1 of the dielectric layer 32 may be greater than about 100 μm when the k-value of the dielectric layer 32 is about 3 or greater and the patch antenna has an operating frequency of about 60 GHz. As another example, the thickness T1 of dielectric layer 32 may be greater than about 30 μm when the k-value of the dielectric layer 32 is less than 3 (e.g., about 1) and the patch antenna has an operating frequency of about 60 GHz.

Over dielectric layer 32 may reside dielectric buffer layer 34. Dielectric buffer layer 34 may be formed of an organic material (such as a polymer), which may be polyimide, PBO, or the like, or an inorganic material such as oxide, nitride, or the like. It is appreciated that dielectric layer 34 also has the function of isolating EMI. The previous discussed thickness T1 of dielectric layer 32 is based on the assumption that dielectric layer 34 is much thinner (for example, with thickness T2 smaller than about 10 percent of thickness T1).

In accordance with some embodiments of the present disclosure, conductive film (which is also referred to as a foil or a plate) 36 is placed (when it is pre-formed) on dielectric layer 34. The respective process is also illustrated as process 208 in the process flow shown in FIG. 29. Conductive film 36 may also be deposited on dielectric layer 34. Conductive film may be a metal film formed of copper, titanium, nickel, or multi-layer thereof. In accordance with some embodiments of the present disclosure, dielectric layers 32 and 34 and conductive film 36 are pre-formed as a unit, and the unit is placed on dielectric layer 28. In accordance with alternative embodiments, dielectric layers 32 and 34 are pre-formed and then placed over dielectric layer 28, followed by forming conductive film 36, for example, through a deposition process such as Physical Vapor Deposition (PVD), Chemical Vapor Deposition (CVD), or the like, and followed by a patterning step. In the top view, conductive film 36 may be a solid plate with no opening therein, a mesh (grid) with openings therein to reveal the underlying dielectric layer 34, or a plurality of interconnected or discrete parallel strips.

Figure 4:
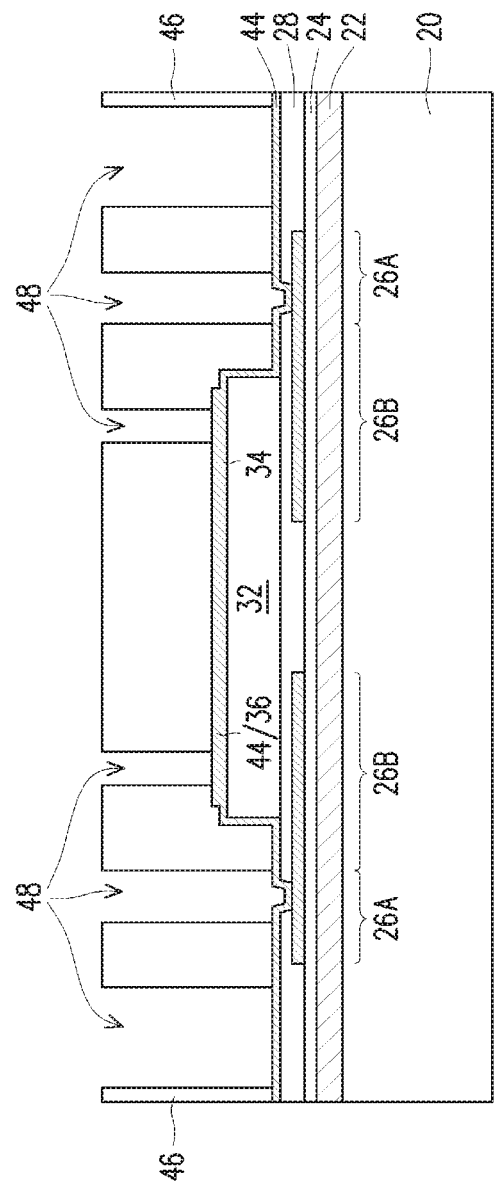
Figure 5:
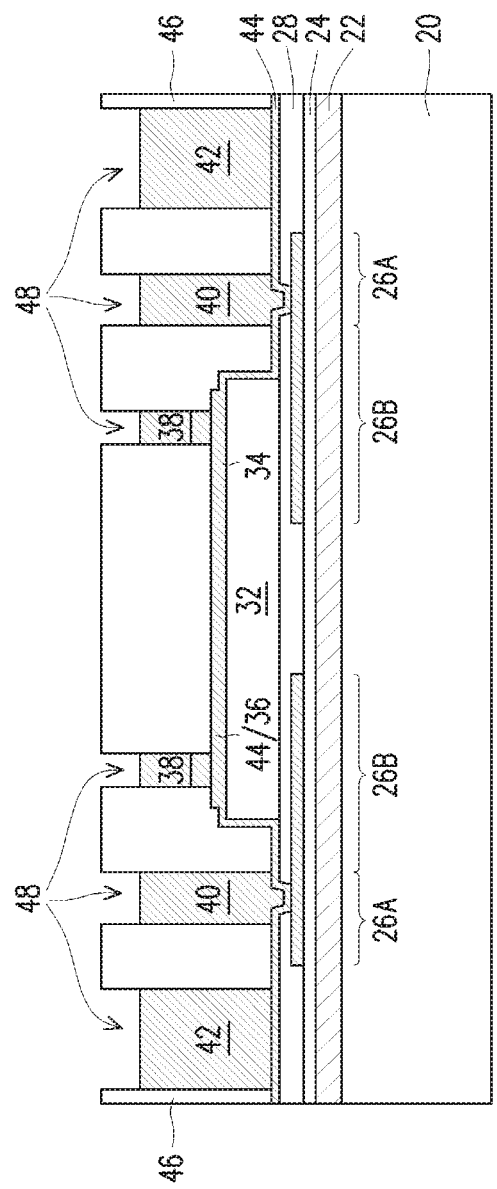
Figure 6:
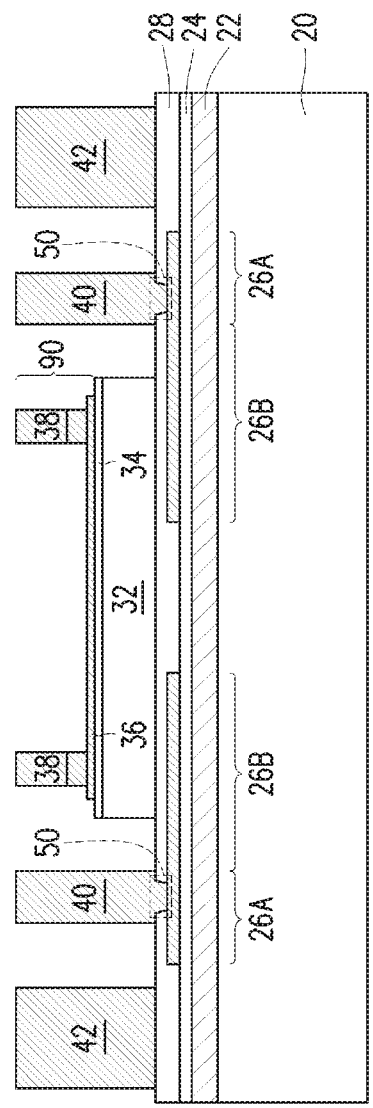

FIGS. 4 through 7 illustrate the formation of side-shielding structure 38, conductive posts 40, and optionally antenna 42 (FIG. 6). Throughout the description, metal posts 40 are alternatively referred to as through-vias 40 since metal posts will penetrate through the subsequently dispensed encapsulating material. Referring to FIG. 4, metal seed layer 44 is formed as a blanket layer, for example, through PVD. A portion of the metal seed layer 44 overlaps metal film 36. Metal seed layer 44 may include copper, or may include a titanium layer and a copper layer over the titanium layer in accordance with some embodiments. Photo resist 46 is formed over metal seed layer 44. The respective process is illustrated as process 210 in the process flow shown in FIG. 29. In accordance with some embodiments of the present disclosure, photo resist 46 is a dry film, which is laminated onto metal seed layer 44. In accordance with alternative embodiments of the present disclosure, photo resist 46 is dispensed through spin coating.

A light-exposure is then performed on photo resist 46 using a photo lithography mask (not shown), which includes transparent portions allowing light to pass through and opaque portions for blocking the light. After the development of the exposed photo resist 46, openings 48 are formed in photo resist 46. Metal seed layer 44 thus has some portions exposed to openings 48.

Next, as shown in FIG. 5, side-shielding structure 38, conductive posts 40, and antennas 42 (FIG. 7) are formed through a plating process such as an electro-less plating process or electro-chemical plating process. The respective process is illustrated as process 212 in the process flow shown in FIG. 29. In subsequent steps, photo resist 46 is removed, and hence the underlying portions of metal seed layer 44 are exposed. The exposed portions of metal seed layer 44 are then removed in an etching step. The respective process is illustrated as process 214 in the process flow shown in FIG. 29. The resulting side-shielding structure 38, conductive posts 40, and antennas 42 are illustrated in FIG. 6. Since metal film 36 (FIG. 3) is thicker than seed layer, and also because metal film 36 may be formed of a material different than the bottom layer of metal seed layer 44, metal film 36 remains after metal seed layer 44 is removed. Throughout the description, the remaining portions of metal seed layer 44 are also considered as parts of the respective side-shielding structure 38, conductive posts 40, and antennas 42. The above process also forms vias 50 that extend into dielectric layer 28 to electrically connect conductive posts 40 to conductive features 26.

Figure 24B:
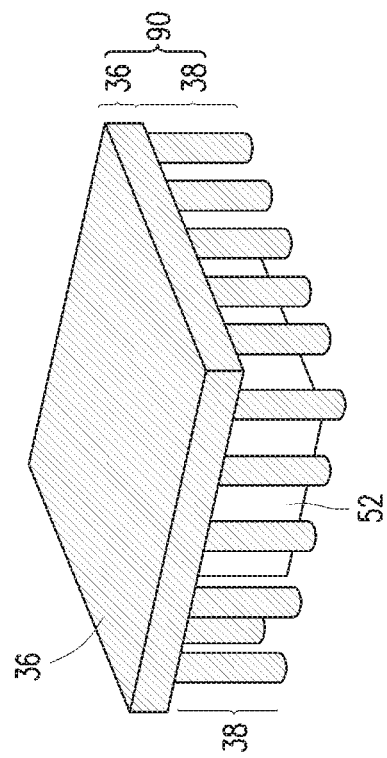
FIGS. 24A, 24B, 24C, and 24D illustrate the perspective views of some shielding structures in accordance with some embodiments.
Figure 24A:
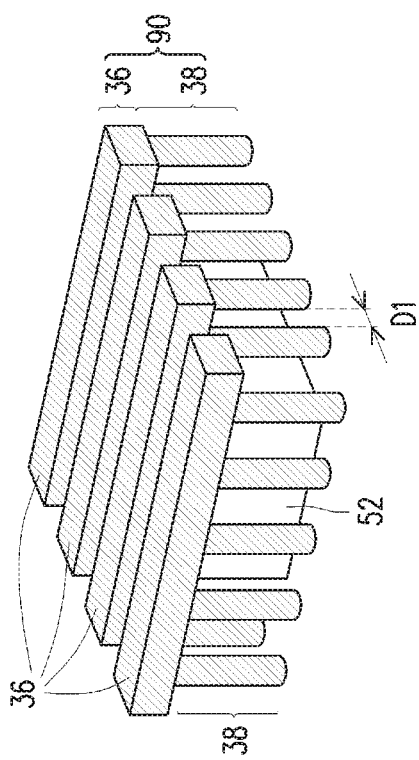

When viewed from the top of the structure shown in FIG. 6, side-shielding structure 38 may have a shape selected from a plurality of candidate shapes. For example, side-shielding structure 38 may include a plurality of discrete posts (similar to what are shown in FIGS. 24A and 24B), whose bottoms contact the top surface of conductive film 36. The plurality of discrete posts are closely located, with the distance small enough to block electro-magnetic signals, and the plurality of discrete posts are aligned to a ring. The discrete posts may have the top-view shape of circles, rectangles, hexagons, ellipses, elongated strips, or the like. Side-shielding structure 38 may alternatively have a top-view shape of a full ring (with no break therein). Antenna 42 may be formed, and are allocated as one or a plurality of groups. In accordance with some embodiments of the present disclosure, each group includes two L-shaped portions, with the bottom legs of the two L-shaped portions located between the two vertical portions of the two L-shaped portions.

FIG. 7 illustrates the placement of device die 52. The respective process is illustrated as process 216 in the process flow shown in FIG. 29. Device die 52 is adhered to dielectric layer 28 through Die-Attach Film (DAF) 54, which is an adhesive film. To form DAF 54 and the attached device die 52, DAF 54 may be pre-attached to a wafer in which device die 52 is located, and then DAF 54 and the wafer are sawed from the wafer. Accordingly, the edges of device die 52 are flush with the respective edges of DAF 54. Device die 52 may be an RF die, which is configured to generate and/or receive RF signals. Device die 52 may also be a logic device die including logic transistors therein. Device die 52 may also be a Baseband (BB) die.

In accordance with some embodiments of the present disclosure, metal pillars 56 (such as copper posts) or metal pads are pre-formed as the topmost portions of device die 52, and metal pillars 56 are electrically coupled to the integrated circuit devices (not shown) such as transistors in device die 52. In accordance with some embodiments of the present disclosure, a dielectric material such as a polymer fills the gaps between neighboring metal pillars 56 to form top dielectric layer 58. Dielectric layer 58 may be formed of polyimide or PBO in accordance with some embodiments. In accordance with some embodiments of the present disclosure, the top surface of dielectric layer 58 is higher than or coplanar with the top surface of metal pillars 56 at the time device die 52 is placed.

Next, as also shown in FIG. 7, encapsulating material (encapsulant) 60 is encapsulated on device die 52, side-shielding structure 38, conductive posts 40, and antennas 42. The respective process is also illustrated as process 216 in the process flow shown in FIG. 29. Encapsulating material 60 fills the gaps between side-shielding structure 38, through-vias 40, device die 52, and antennas 42. Encapsulating material 60 may include a molding compound, a molding underfill, an epoxy, or a resin. In accordance with some embodiments of the present disclosure, encapsulating material 60 comprises a base material and filler particles in the base material. The base material may be an epoxy, a resin, a polymer, or the like. The filler particles may be spherical particles of silica, aluminum oxide, or the like. Encapsulating material 60 may also be a homogenous material, which means that the material(s) of each part of the encapsulating material 60 is the same as other parts. For example, the entirety of encapsulating material 60 may be molding compound including the same base material and the same filler particles. Furthermore, the portion of encapsulating material 60 inside side-shielding structure 38 is the same as the portion of encapsulating material 60 outside of side-shielding structure 38.

Further referring to FIG. 7, a planarization process such as a Chemical Mechanical Polish (CMP) process or a mechanical grinding process is performed to thin encapsulating material 60, until metal pillars 56, side-shielding structure 38, conductive posts 40, and antennas 42 are exposed. The respective process is also illustrated as process 216 in the process flow shown in FIG. 29. Due to the planarization, the top ends of metal pillars 56 are substantially level (coplanar) with the top surfaces of side-shielding structure 38, conductive posts 40, and antennas 42, and are substantially coplanar with the top surface of encapsulating material 60. Throughout the description, conductive posts 40 are alternatively referred to as through-vias 40 since they penetrate through encapsulating material 60.

Figure 8:
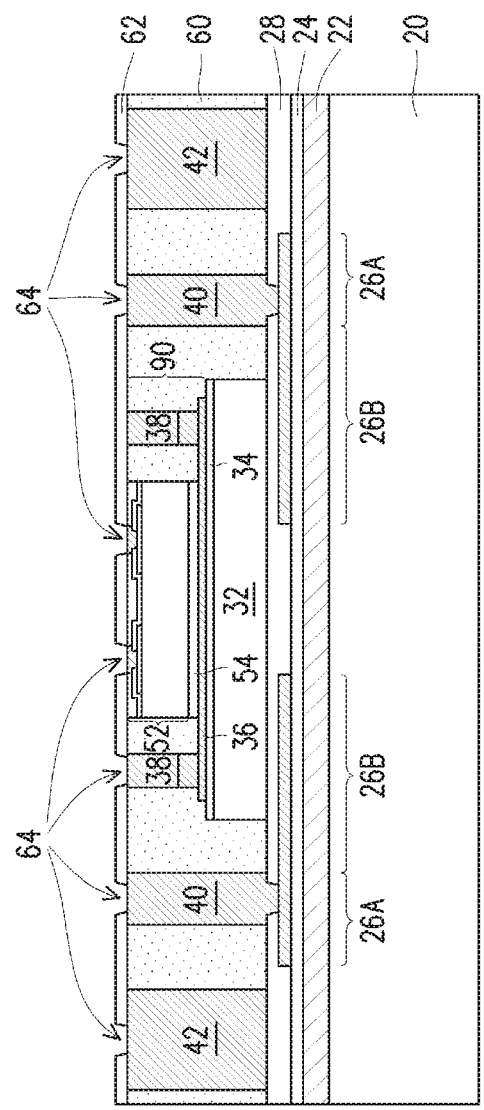

FIGS. 8 through 12 illustrate the formation of front-side RDLs and conductive connectors. The respective process is illustrated as process 218 in the process flow shown in FIG. 29. Referring to FIG. 8, dielectric layer 62 is formed. In accordance with some embodiments of the present disclosure, dielectric layer 62 is formed of an organic material such as a polymer, which may be PBO, polyimide, or the like. In accordance with alternative embodiments of the present disclosure, dielectric layer 62 is formed of an inorganic material such as silicon nitride, silicon oxide, or the like. Openings 64 are formed in dielectric layer 62 to expose side-shielding structure 38, through-vias 40, antennas 42, and metal pillars 56. The formation of openings 64 may include a photo lithography process including light-exposing and then developing dielectric layer 62.

Figure 9:
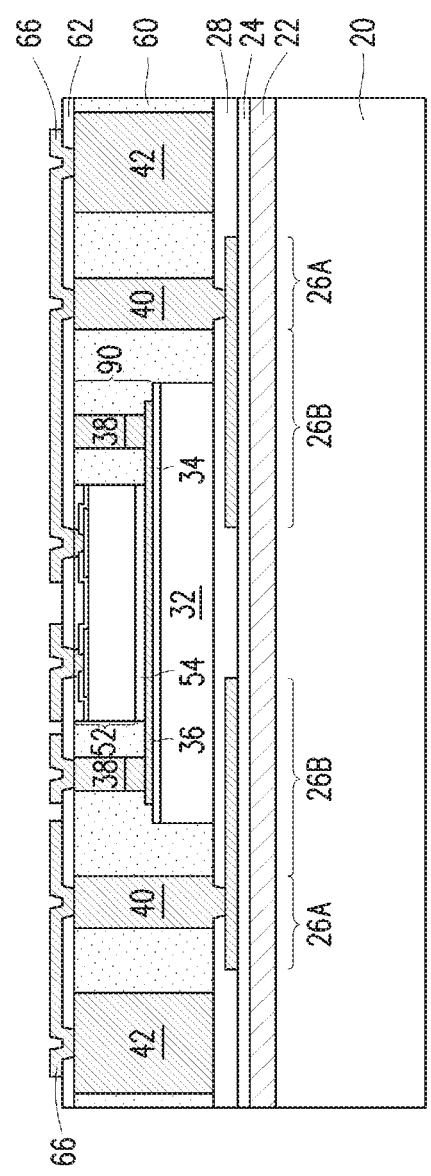

Next, referring to FIG. 9, RDLs 66 are formed to connect to (and may also interconnect) metal pillars 56, side-shielding structure 38, through-vias 40, antennas 42, and metal pillars 56. RDLs 66 include metal traces (metal lines) over dielectric layer 62 as well as vias extending into the openings in dielectric layer 62. The formation of RDLs 66 may include a plating process, wherein each of RDLs 66 includes a seed layer (not shown) and a plated metallic material over the seed layer. The seed layer and the plated material may be formed of the same material or different materials. RDLs 66 may comprise a metal or a metal alloy including aluminum, copper, tungsten, and alloys thereof.

Figure 10:
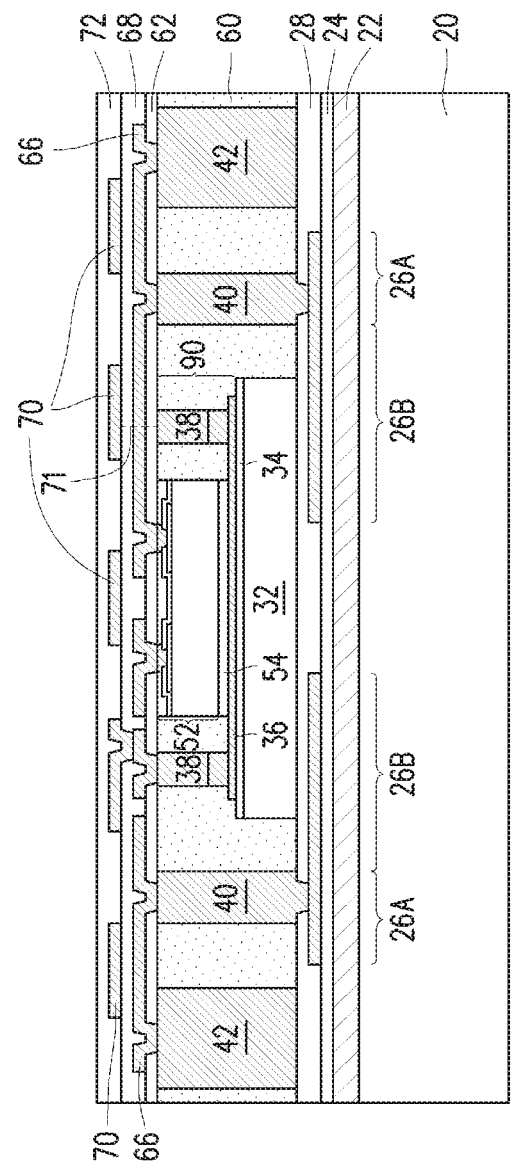

Referring to FIG. 10, dielectric layer 68, RDLs 70, and dielectric layer 72 are formed over RDLs 66 and dielectric layer 62. Dielectric layer 68 may be formed using a material selected from the same candidate materials as those of dielectric layer 62. For example, dielectric layer 68 may comprise PBO, polyimide, or the like. Alternatively, dielectric layer 68 may include non-organic dielectric materials such as silicon oxide, silicon nitride, silicon carbide, silicon oxynitride, or the like.

RDLs 70 are electrically connected to RDLs 66. The formation of RDLs 70 may adopt similar methods and materials as those for forming RDLs 66. RDLs 70 and 66 are also referred to as front-side RDLs since they are located on the front side of device die 52. Dashed line 71 is illustrated to represent the electrical connection between a part of side-shielding structure 38 and one of RDLs 70. The dashed line indicates that the electrical connection is not in the illustrated plane. As also shown in FIG. 10, an additional dielectric layer 72 is formed to cover RDLs 70 and dielectric layer 68. Dielectric layer 72 may be formed of a material selected from the same candidate materials used for forming dielectric layers 62 and 68.

Figure 11:
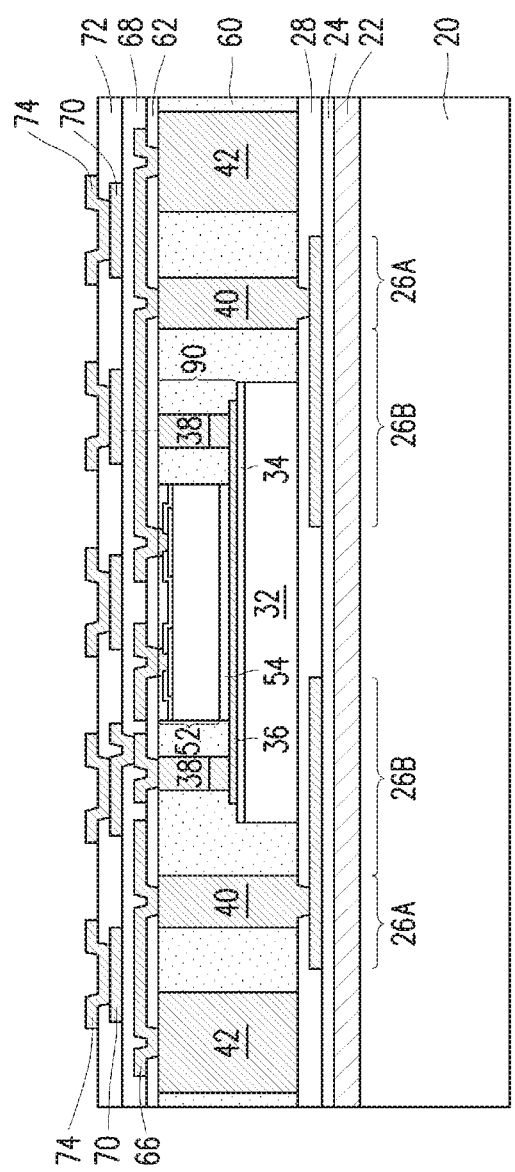
Figure 12:
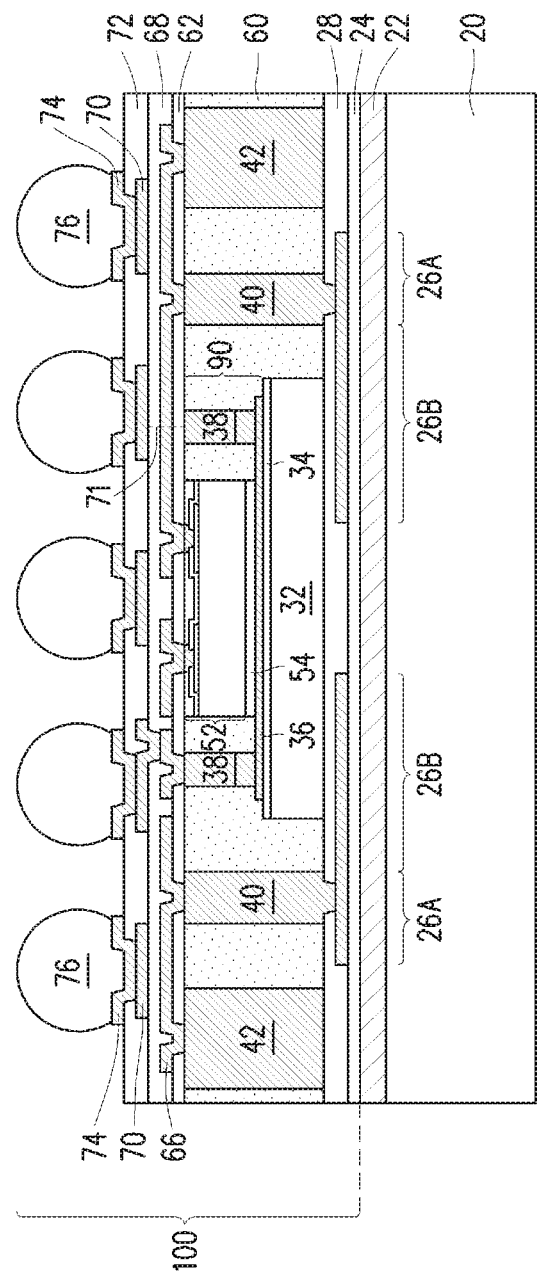

FIGS. 11 and 12 illustrate the formation of Under-Bump Metallurgies (UBMs) 74 (FIG. 11) and the formation of electrical connectors 76 (FIG. 12) in accordance with some embodiments. The formation of UBMs 74 may include patterning dielectric layer 72 to form openings, and depositing and patterning a metal layer(s) such as a titanium layer and a copper layer over the titanium layer. The formation of electrical connectors 76 may include placing solder balls on the exposed portions of UBMs 74 and then reflowing the solder balls. In accordance with alternative embodiments of the present disclosure, the formation of electrical connectors 76 includes performing a plating step to form solder regions over RDLs 70 and then reflowing the solder regions. Electrical connectors 76 may also include metal pillars, and optionally solder caps on metal pillars, which may also be formed through plating. Throughout the description, the combined structure including dielectric layer 24 and the overlying structure will be referred to as package 100, which may be a composite wafer with a round top-view shape. The composite wafer 100 includes a plurality of components identical to each other, with each of the components being illustrated in FIG. 12 in accordance with some embodiments.

Next, package 100 is de-mounted from carrier 20. The respective process is illustrated as process 220 in the process flow shown in FIG. 29. In the de-mounting, tape 78 (FIG. 13) may be adhered onto electrical connectors 76. In subsequent steps, radiation such as UV light or a laser beam is projected on release film 22 to decompose release film 22, and carrier 20 is demounted from package 100.

Figure 13:
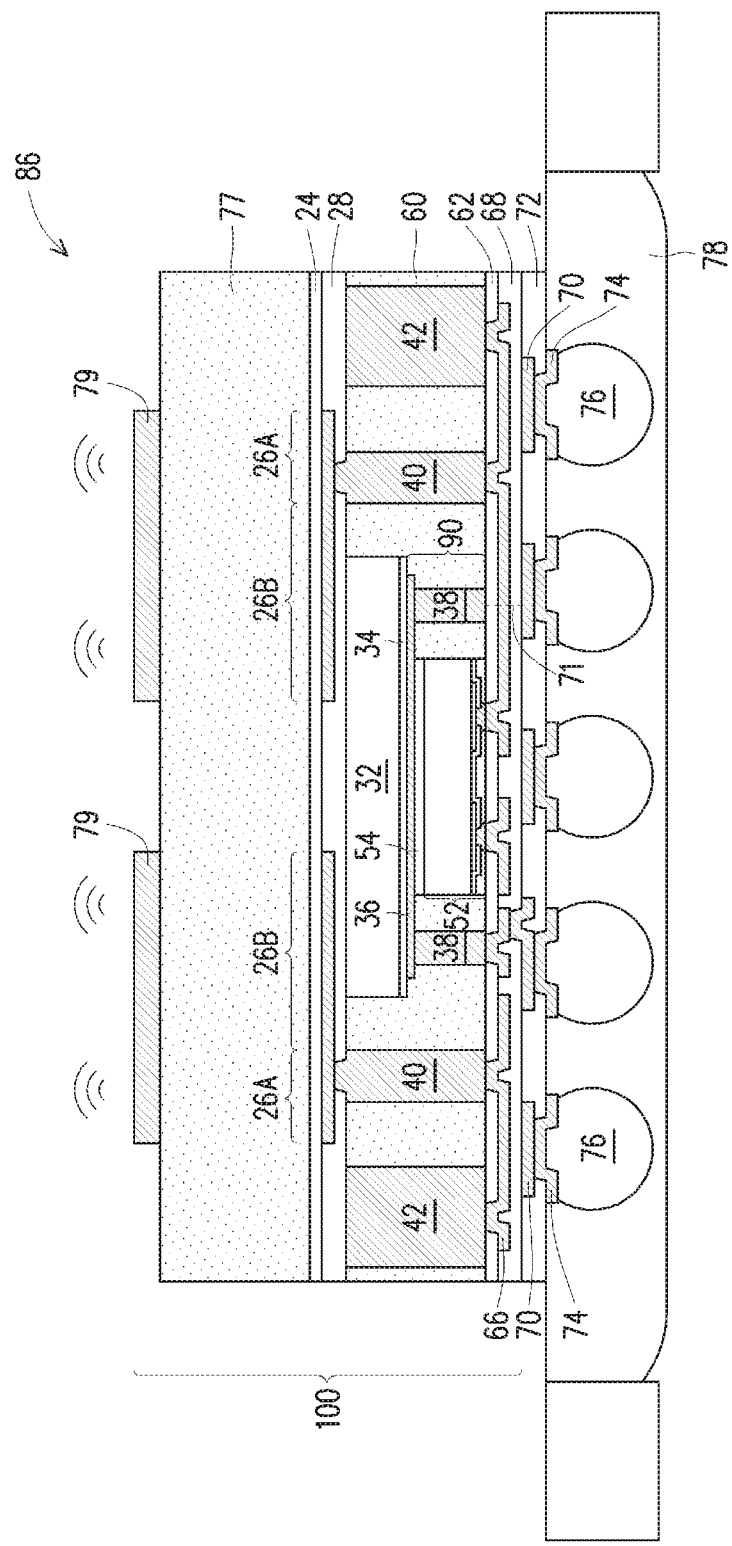

Next, as shown in FIG. 13, dielectric layer 77 is formed over dielectric buffer layer 24. The respective process is illustrated as process 222 in the process flow shown in FIG. 29. In accordance with some embodiments of the present disclosure, dielectric layer 77 is formed of molding compound, and is formed by dispensing and then curing the molding compound. The molding compound 77 may also include a base material (such as a resin or a polymer), and spherical particles in the base material. Dielectric layer 77 may also be formed of other dielectric materials, which may be inorganic materials such as oxides, nitrides, carbides, or the like. A planarization process may be performed to planarize the top surface of dielectric layer 77.

Patch antennas 79 are formed over dielectric layer 77. The respective process is also illustrated as process 222 in the process flow shown in FIG. 29. In accordance with some embodiments of the present disclosure, patch antennas 79 are formed of a metal, which may be formed of copper, aluminum, tungsten, nickel, silver, gold, alloys thereof, and/or multi-layers thereof. Patch antennas 79 are electrically floating, and overlaps the underlying patch antennas 26B.

A singulation (die-saw) step is performed to saw package 100 into a plurality of packages, each being similar to what is shown in FIG. 13. The respective process is illustrated as process 224 in the process flow shown in FIG. 29. One of the resulting packages is shown as package 80 in FIG. 14.

Figure 14:
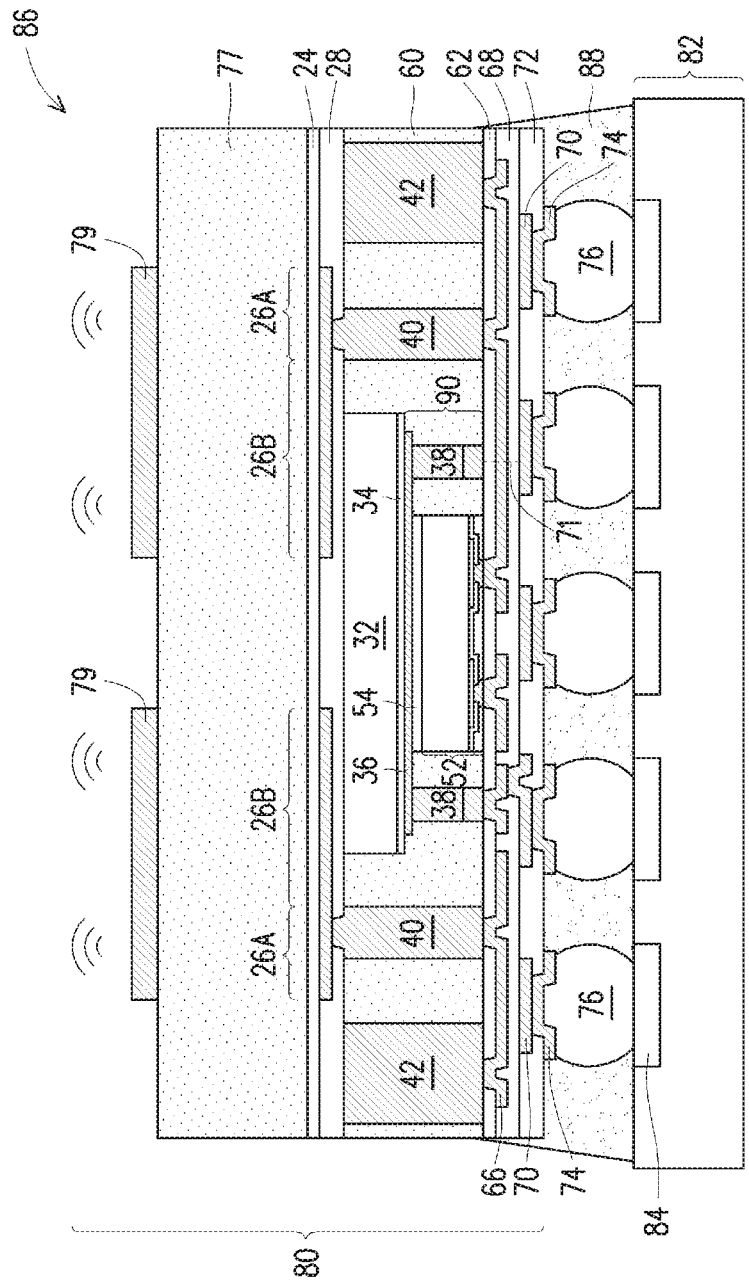
Figure 15:
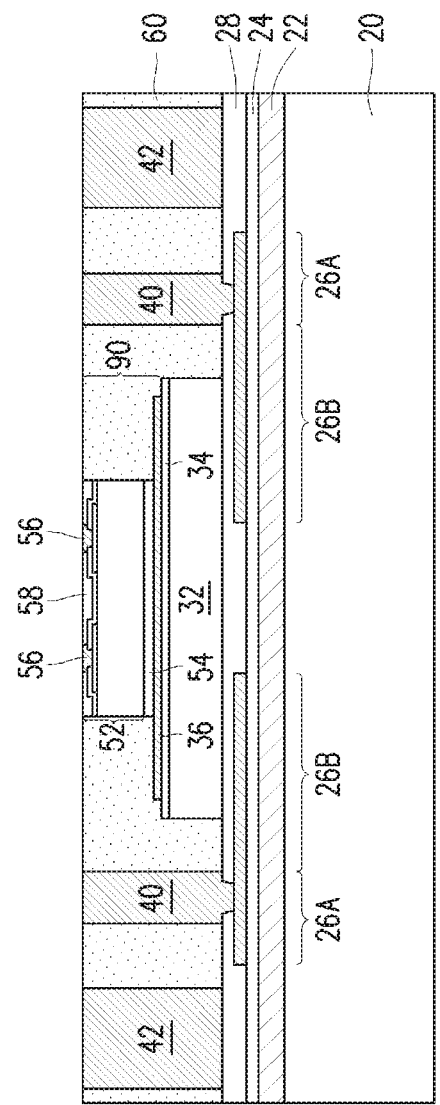
FIGS. 15 through 18 illustrate the cross-sectional views of intermediate stages in the formation of a package in accordance with some embodiments.

FIG. 14 illustrates the bonding of package 80 with package component 82. The respective process is illustrated as process 226 in the process flow shown in FIG. 29. In accordance with some embodiments of the present disclosure, the bonding is performed through electrical connectors 76, which may include solder regions bonded to conductive features 84 in package component 82. In accordance with some embodiments of the present disclosure, package component 82 is a package substrate, which may be a coreless substrate or a substrate having a core (such as a fiberglass-reinforced core). In accordance with other embodiments of the present disclosure, package component 82 is a printed circuit board or a package. Underfill 88 may be disposed between package 80 and package component 82. The package in FIG. 14 is referred to as package 86 hereinafter.

As shown in FIG. 14, patch antennas 26B and patch antennas 79 form a stacked patch antenna(s), which is signally coupled to device die 52. A ground panel(s) (not shown) may be formed in the RDLs underlying device die 52. The ground panel(s) may be under the feeding lines interconnecting device die 52 and the stacked patch antennas. Patch antennas 79 overlap, and are coupled to, patch antennas 26B through electro-magnetic field. Throughout the description, metal film 36 and side-shielding structure 38 are in combination referred to as shielding structure 90, wherein the metal film 36 forms the cap of shielding structure 90, and side-shielding structure 38 forms the skirt of shielding structure 90. Shielding structure 90 is electrically grounded through RDLs 66, 70, and electrical structures 76, and hence has the function of shielding device die 52 from the EMI of the stacked patch antenna. Some of the grounding paths are represented by dashed line 71. In accordance with some embodiments of the present disclosure, side-shielding structure 38 includes a plurality of metal posts, and each of the plurality of metal posts may be electrically grounded individually to achieve better shielding effect.

In FIG. 14, patch antennas 26B and 79 have portions overlapping some portions of device die 52. Accordingly, the area occupied by package 86 is reduced. The overlapping may cause the worsening of EMI between device die 52 and the patch antennas 26B and 79. In accordance with some embodiments of the present disclosure, the EMI problem is reduced by forming shielding structure 90 and inserting dielectric layers 32 and 34 (that have enough thickness) between shielding structure 90 and patch antennas 26B and 79.

Figure 23:
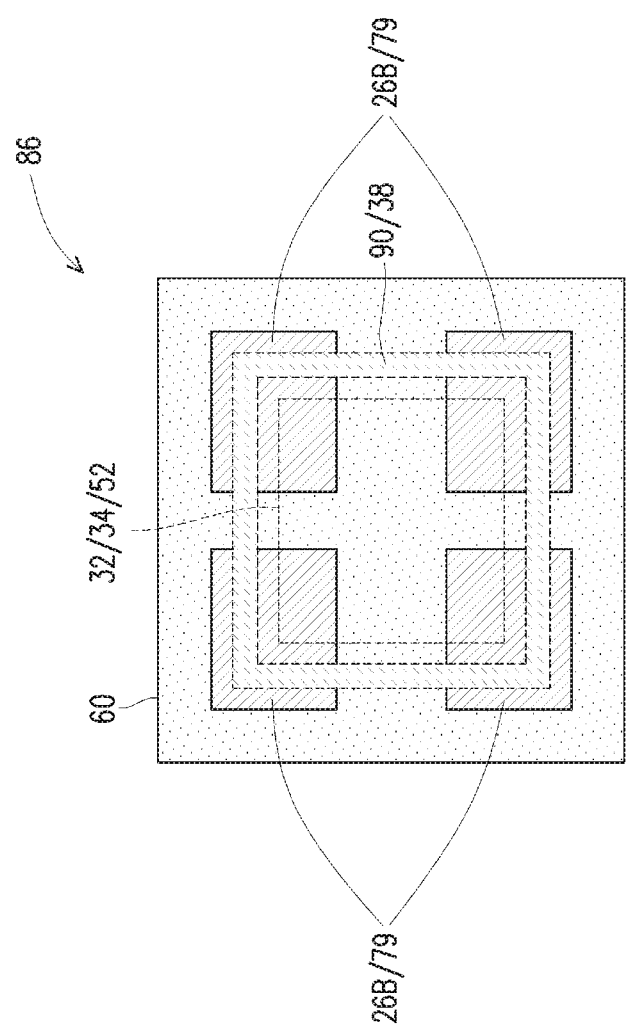
FIG. 23 illustrates a top view of a package in accordance with some embodiments.

FIG. 23 illustrates a top view of parts of package 86. Shielding structure 90 includes skirt 38, which forms a ring encircling device die 52 and dielectric layers 32 and 34.

Encapsulating material 60 encapsulates shielding structure 90 therein. Encapsulating material 60 includes an outer portion encircling shielding structure 90, and an inner portion encircled by the skirt 38 of shielding structure 90.

FIGS. 15 through 22 illustrate the cross-sectional views of intermediate stages in the formation of packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 14. The details regarding the formation process and the materials of the components shown in FIGS. 15 through 22 may thus be found in the discussion of the embodiments shown in FIGS. 1 through 14.

Figure 16:
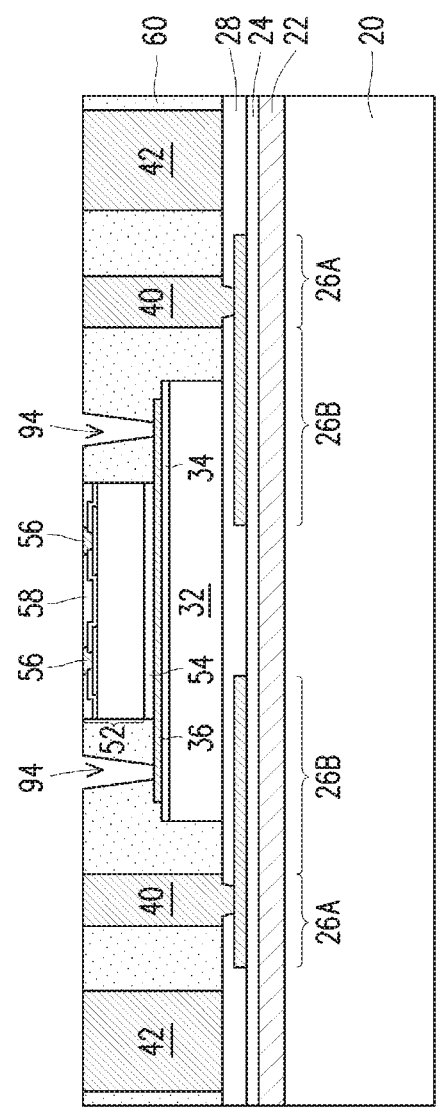

FIGS. 15 through 18 illustrate the cross-sectional views of intermediate stages in the formation of a package in accordance with some embodiments of the present disclosure. These embodiments are similar to the embodiments shown in FIGS. 1 through 14, except that side-shielding structure 38 is formed differently. These embodiments may be adopted when the height difference between side-shielding structure 38 and through-vias 40 are greater than the process margin, and hence side-shielding structure 38 and through-vias 40 cannot be plated simultaneously. The initial steps of these embodiments are essentially the same as shown in FIGS. 1 through 7 to form the structure shown in FIG. 15, except the side-shielding structure 38 shown in FIG. 7 is not formed in the structure shown in FIG. 15. Next, as shown in FIG. 16, openings 94 are formed in encapsulating material 60 to review some parts of metal film 36. Openings 94 may be formed through laser drilling or etching, for example. When formed through laser drilling, openings 94 may have top widths greater than the respective bottom widths.

Figure 17:
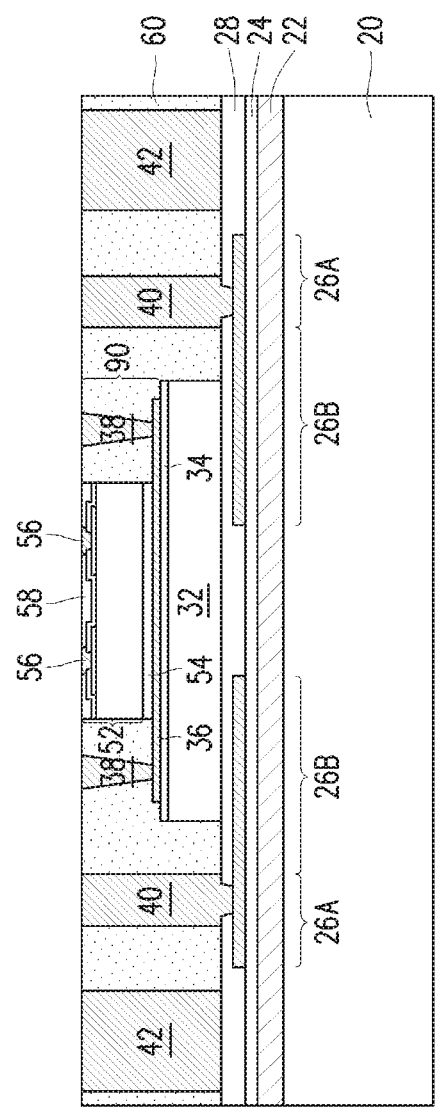
Figure 18:
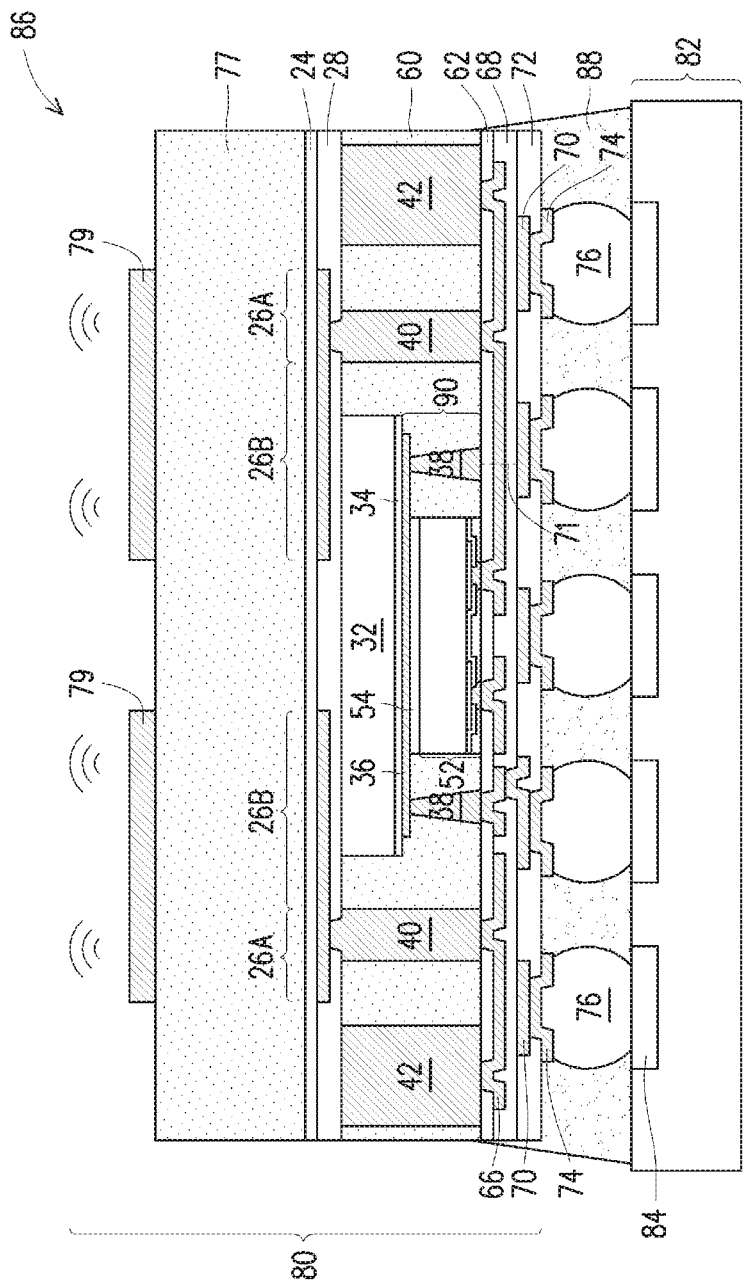

Next, as shown in FIG. 17, a conductive paste is filled into openings 94 (FIG. 16), and is then cured to form side-shielding structure 38. The filling may be achieved through stencil printing, for example. The conductive paste may include a copper paste, a silver paste, or the like. The subsequent steps may be essentially the same as what are shown and discussed referring to FIGS. 8 through 14, and the details are not repeated herein. The resulting package 86 is shown in FIG. 18.

Figure 19:
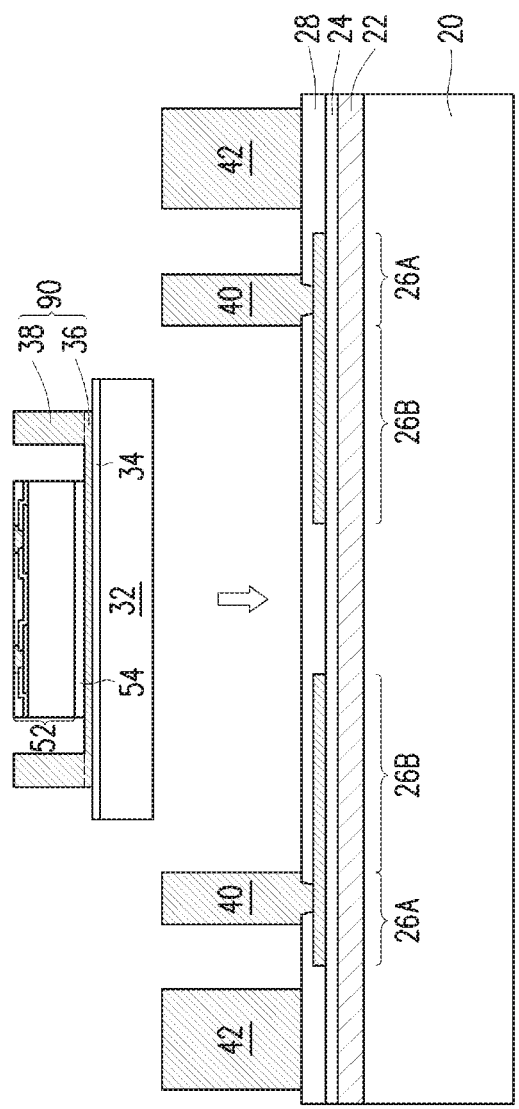
FIGS. 19 and 20 illustrate the cross-sectional views of intermediate stages in the formation of a package in accordance with some embodiments.
Figure 20:
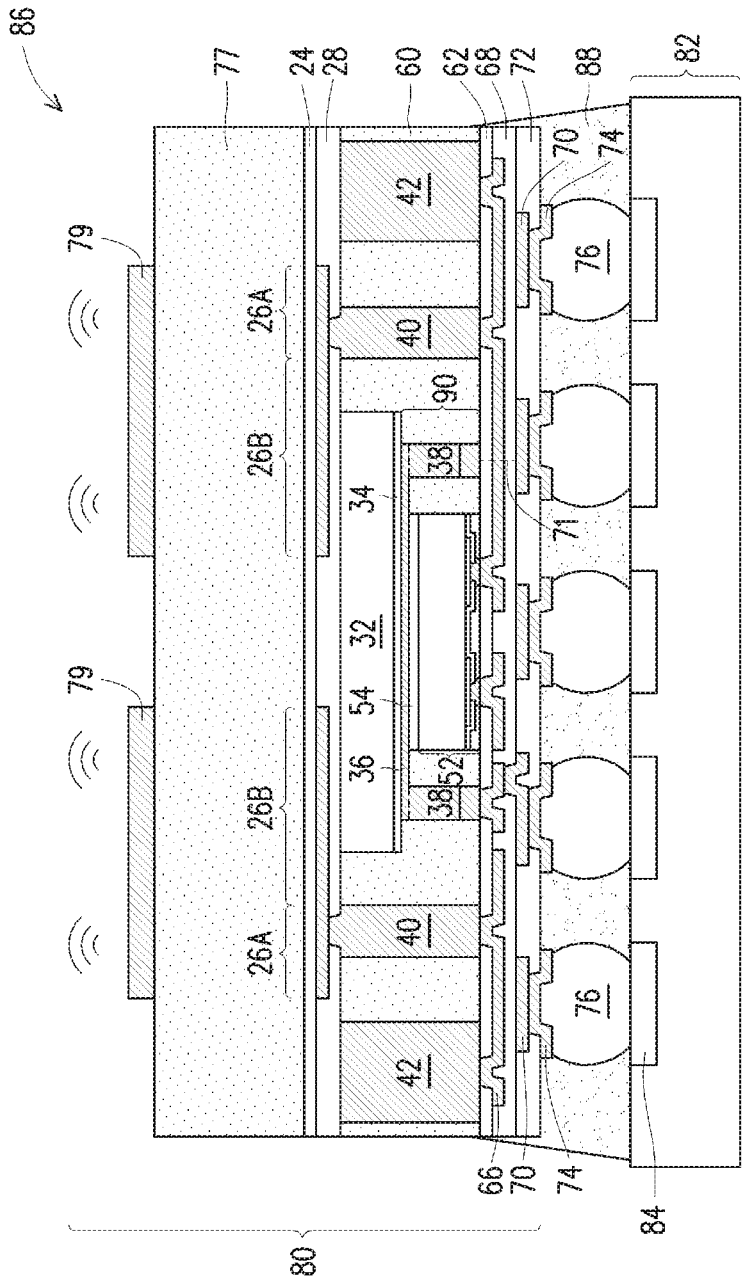

FIGS. 19 and 20 illustrate the cross-sectional views of intermediate stages in the formation of a package in accordance with some embodiments of the present disclosure. These embodiments are similar to the embodiments as shown in FIGS. 1 through 14, except that shielding structure 90 is pre-formed as an integrated unit. The initial steps of these embodiments are essentially the same as shown in FIGS. 1 through 7 to form the structure shown in FIG. 19, except when through-vias 40 and antennas 42 are formed, while the side-shielding structure (FIG. 7) is not formed.

In accordance with some embodiments of the present disclosure, as shown in FIG. 19, shielding-structure 90 is pre-formed, and is then attached to dielectric layers 32 and 34. Device die 52 is then attached to shielding-structure 90. Components 32, 34, 90 and 52 thus in combination form a discrete unit. The discrete unit is then placed on dielectric layer 28. In accordance with alternative embodiments of the present disclosure, dielectric layers 32 and 34 are placed on dielectric layer 28 first, and then device die 52 is placed inside and attached to shielding structure 90. Shielding-structure 90 in accordance with these embodiments may have the shape of a basin, with the skirt 38 and cap 36 being formed of the same material, and as an integrated piece with no distinguishable interface therebetween. The subsequent steps may be essentially the same as what are shown and discussed referring to FIGS. 8 through 14, and the details are not repeated herein. The resulting package 86 is shown in FIG. 20.

Figure 21:
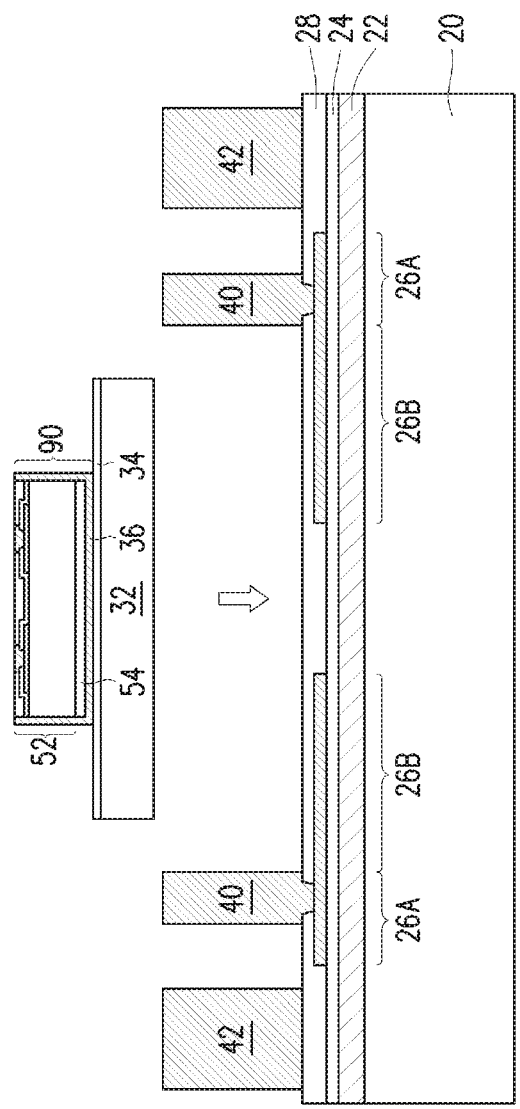
FIGS. 21 and 22 illustrate the cross-sectional views of intermediate stages in the formation of a package in accordance with some embodiments.
Figure 22:
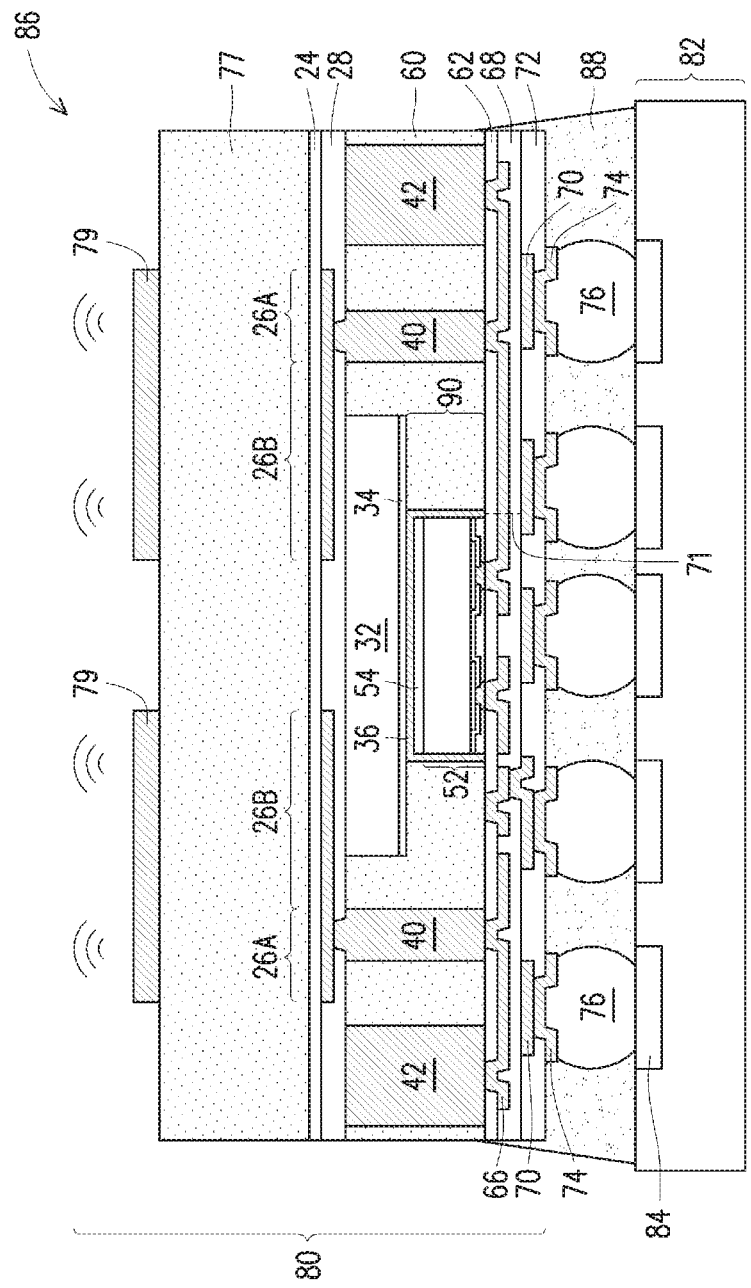

FIGS. 21 and 22 illustrate the cross-sectional views of intermediate stages in the formation of a package in accordance with some embodiments of the present disclosure. These embodiments are similar to the embodiments as shown in FIGS. 1 through 14, except that shielding structure 90 is pre-formed on device die 52 by spraying a conductive paste (such as a copper paste or a silver paste), or through a sputter process. The DAF 54 may exist, or may be omitted so that the conductive paste contacts the bottom surface of device die 52. The initial steps of these embodiments are essentially the same as shown in FIGS. 1 through 7 to form the structure shown in FIG. 21, except when through-vias 40 and antennas 42 are formed, while the side-shielding structure 38 (FIG. 7) is not formed.

In accordance with some embodiments of the present disclosure, as shown in FIG. 21, device die 52 and the pre-formed shielding-structure 90 are attached to dielectric layers 32 and 34 to form a discrete unit. The discrete unit is then placed on dielectric layer 28. The subsequent steps may be essentially the same as what are shown and discussed referring to FIGS. 8 through 14, and the details are not repeated herein. The resulting package 86 is shown in FIG. 22.

FIGS. 24A, 24B, 24C, and 24D illustrate the perspective views of some shielding structures 90 in accordance with some embodiments of the present disclosure. These embodiments may be used in the structures shown in FIGS. 14, 18, 20 and 22 whenever applicable. Referring to FIG. 24A, the cap 36 of shielding structures 90 includes a plurality of discrete metal strips, which are separate from each other. Side-shielding structure 38 includes a plurality of metal posts connected to the discrete strips. Each of the metal posts may be electrically grounded individually. The distance D1 between neighboring metal posts are small to achieve efficient EMI isolation, for example, with the distance D1 being lower than about 5 percent of the wavelength of the RF signal, which is either transmitted or received by the patch antennas. Device die 52 is in the ring formed of the metal posts in the side-shielding structure 38.

Figure 24D:
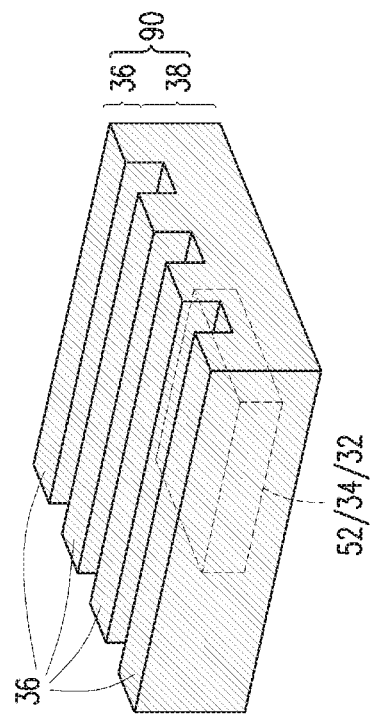
Figure 24C:
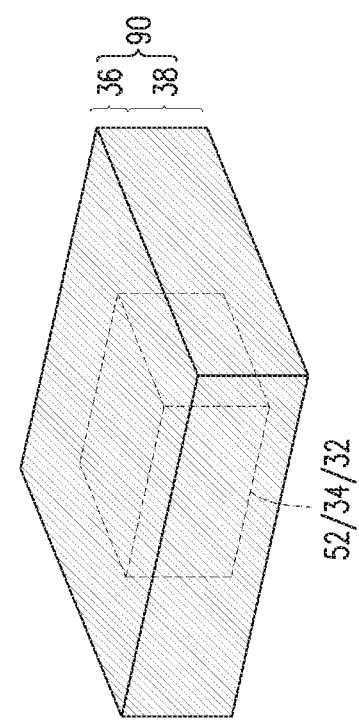

FIG. 24B illustrates a shielding structure 90 similar to the shielding structures 90 shown in FIG. 24A, except that cap 36 is a solid plate. In accordance with alternative embodiments (not shown), cap 36 may be a mesh (grid), with through-openings penetrating through cap 36. FIG. 24C illustrates that cap 36 is a solid plate, and side-shielding structure 38 is a solid wall, which may fully encircle device die 52 therein. FIG. 24D illustrates that that cap 38 includes discrete strips, while side-shielding structure 38 is a solid ring. The shielding structures 90 as shown in FIGS. 24B, 24C, and 24D may be pre-formed, and then attached as shown in FIG. 19.

Figure 25:
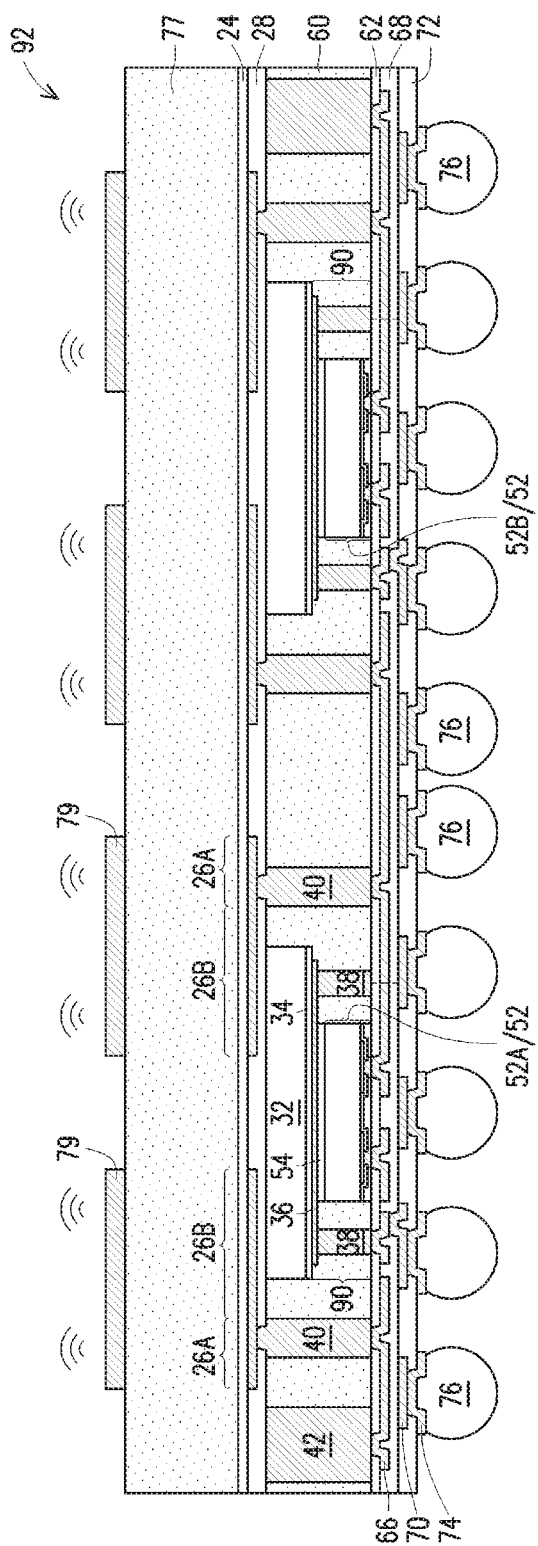
FIGS. 25 through 28 illustrate the cross-section views of some packages with shielding structures in accordance with some embodiments.

FIGS. 25 through 28 illustrate a plurality of packages 92 including shielding structures. It is appreciated that the shielding in the embodiments in FIGS. 25 through 28 may adopt the structure and the formation methods as in FIGS. 1 through 24, whenever applicable. FIG. 25 illustrates a package in accordance with some embodiment of the present disclosure, in which a package includes two shielding structures 90, each having a device die (52A and 52B) therein. Both device dies 52A and 52B may be RF dies. The package may include or may be free from antennas 26B and 79, and the side-shielding structures 90 are used for reducing/eliminating the interference between device dies 52A and 52B, and the interference between device dies 52A and 52B and antennas 26B and 79 (if formed).

Figure 26:
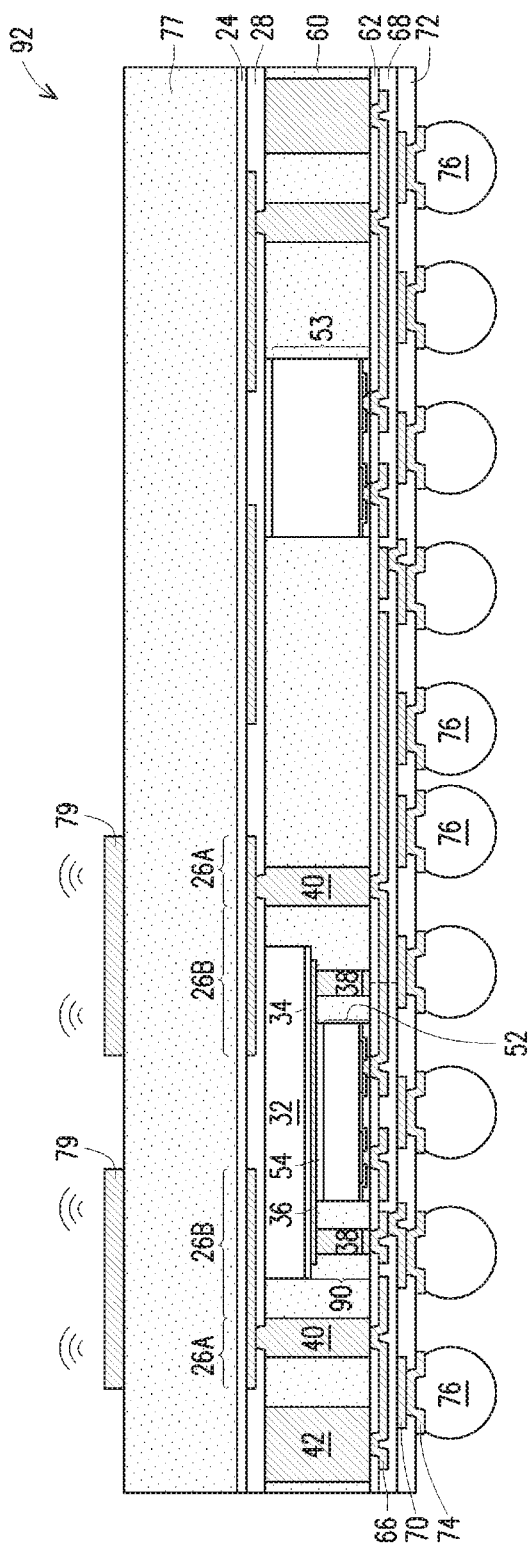

FIG. 26 illustrates package 92 in accordance with some embodiment of the present disclosure, in which side-shielding structure 90 encircles device die 52 therein, which may be an RF device die or a baseband die. Device die 53 is also placed in the package, with device die 53 not encircled and covered by any shielding structure. Device die 53 may be a logic die. The package may include or may be free from antennas, and the shielding structure 90 is used for eliminate the interference between the dies, and between the dies and the antenna (if formed).

Figure 27:
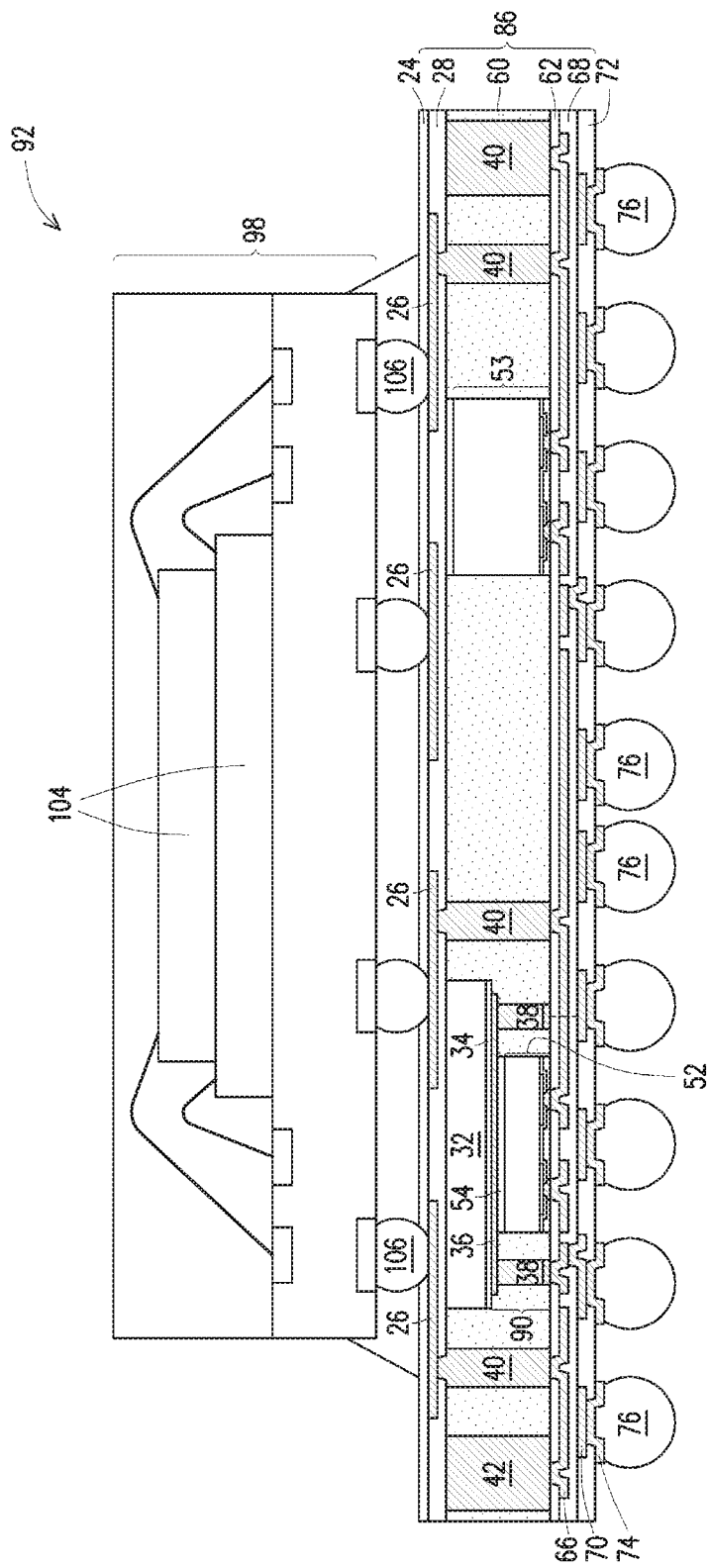
Figure 28:
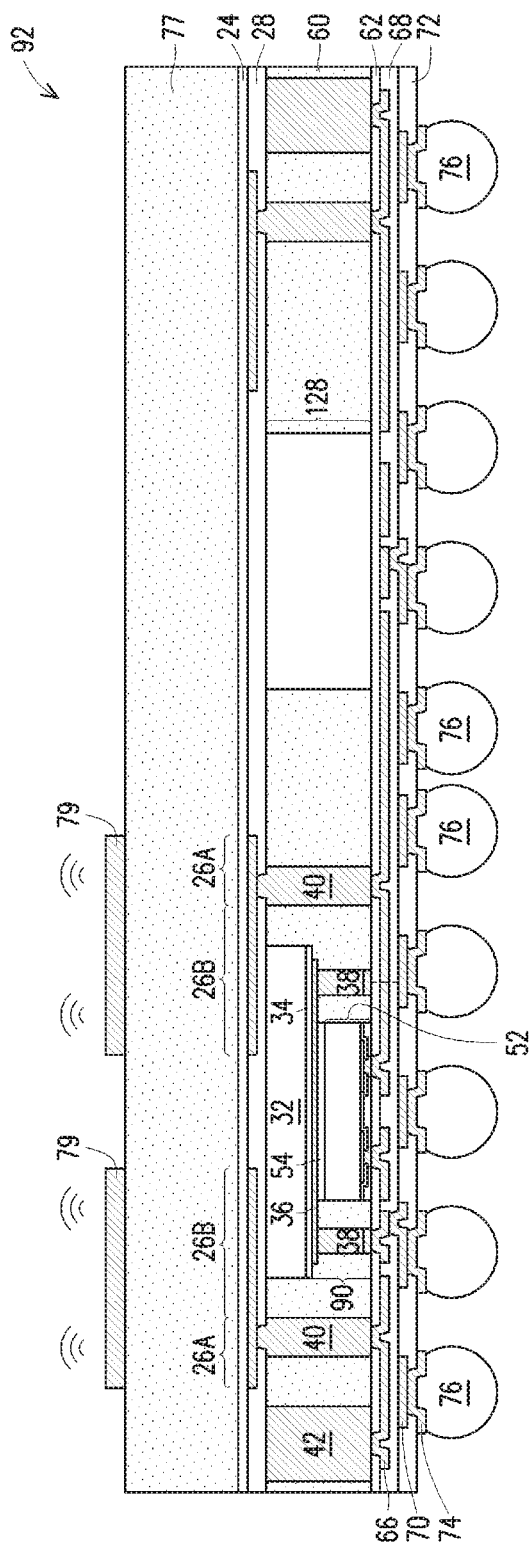

FIG. 27 illustrates package 92 in accordance with some embodiment of the present disclosure, in which a package includes a shielding structure 90 with logic device die 52 placed therein. The package has no antenna built therein. In accordance with some embodiments of the present disclosure, through-vias 40 are connected to backside RDLs 26. Package 98 is bonded to the underlying package 86 through solder regions 106. Package 98 may include device dies 104 therein, which may be memory dies, for example. FIG. 28 is similar to FIG. 26, except dielectric block 108 is encapsulated in encapsulating material 60. Dielectric block 128 may have a low Coefficient of Thermal Expansion (CTE), and hence may reduce the warpage of package 92. For example, the CTE of dielectric block 128 may be lower than about 5 ppm/C°.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming conductive shielding structures to shield device dies, and further by adding dielectric layer(s) to isolate the EMI, the EMI between the device die and antennas is reduced.

In accordance with some embodiments of the present disclosure, a method includes forming a metal post over a first dielectric layer; attaching a second dielectric layer over the first dielectric layer; encapsulating a device die, the second dielectric layer, a shielding structure, and the metal post in an encapsulating material; planarizing the encapsulating material to reveal the device die, the shielding structure, and the metal post; and forming a first antenna electrically coupling to the device die, wherein the first antenna has a portion vertically aligned to a portion of the device die. In accordance with some embodiments, the method further includes forming the shielding structure comprising: attaching a metal film over the second dielectric layer; and forming a side-shielding structure over the metal film, wherein the side-shielding structure and the metal film in combination form the shielding structure. In accordance with some embodiments, the method further includes forming the shielding structure includes attaching a metal film over the second dielectric layer; after the encapsulating, forming an opening in the encapsulating material to reveal a portion of the metal film; and filling a conductive paste into the opening to form a side-shielding structure over the metal film, wherein the side-shielding structure and the metal film in combination form the shielding structure. In accordance with some embodiments, the method further includes pre-forming the shielding structure; attaching the device die to the shielding structure; and attaching the pre-formed shielding structure and the device die as an integrated unit over the second dielectric layer. In accordance with some embodiments, the method further includes spraying a conductive paste onto a surface and a sidewall of the device die to form the shielding structure; and attaching the shielding structure and the device die as an integrated unit over the second dielectric layer. In accordance with some embodiments, the method further includes forming a third dielectric layer, with the third dielectric layer and the device die being on opposite sides of the second dielectric layer; and forming a second antenna on the third dielectric layer, wherein the second antenna is electrically decoupled from the first antenna, and is configured to signally couple to the first antenna through electromagnetic field, and the first antenna and the second antenna in combination form a stacked patch antenna. In accordance with some embodiments, the method further includes electrically grounding the shielding structure.

In accordance with some embodiments of the present disclosure, a method includes forming a first dielectric layer over a carrier; attaching a second dielectric layer to the first dielectric layer; disposing a metal film over the second dielectric layer; forming a side-shielding structure over the metal film; attaching a device die to the metal film, wherein the device die is in a region encircled by the side-shielding structure; encapsulating the device die and the side-shielding structure in an encapsulating material; and forming a first antenna, wherein the first antenna and the device die are on opposite sides of the second dielectric layer, and the first antenna is electrically coupled to the device die. In accordance with some embodiments, the method further includes forming a plurality of redistribution lines, wherein the first antenna and the device die are further interconnected through the plurality of redistribution lines. In accordance with some embodiments, the method further includes forming a metal post, wherein the encapsulating material encapsulates the metal post, and the first antenna and the device die are further interconnected through the metal post. In accordance with some embodiments, the metal post and the side-shielding structure are formed sharing a common plating process. In accordance with some embodiments, the forming the side-shielding structure comprises: depositing a metal seed layer over the first dielectric layer, the second dielectric layer, and the metal film, with the side-shielding structure formed starting from the metal seed layer; and removing portions of the metal seed layer, with remaining portions of the metal seed layer being parts of the side-shielding structure. In accordance with some embodiments, a portion of the first antenna is vertically aligned with a portion of the device die. In accordance with some embodiments, the method further includes forming a third dielectric layer, with the third dielectric layer and the device die being on opposite sides of the second dielectric layer; and forming a second antenna on the third dielectric layer, wherein the second antenna is electrically decoupled from the first antenna, and the first antenna and the second antenna in combination form a stacked patch antenna.

In accordance with some embodiments of the present disclosure, a device includes a device die; a shielding structure encapsulated in an encapsulating material, wherein the device die is in the shielding structure; a through-via penetrating through the encapsulating material; and an antenna having at least a portion overlapping the shielding structure, wherein the antenna is electrically connected to the device die through the through-via. In accordance with some embodiments, the shielding structure includes a conductive cap; and a side-shielding structure connected to the conductive cap, wherein the side-shielding structure forms a ring encircling the device die. In accordance with some embodiments, the device further includes an encapsulating material, wherein the device die and the shielding structure are both encapsulated in the encapsulating material, and edges of the conductive cap are in contact with the encapsulating material to form interfaces. In accordance with some embodiments, the device further includes a die-attach film, wherein the device die is attached to a surface of the conductive cap through the die-attach film. In accordance with some embodiments, the conductive cap and the side-shielding structure have distinguishable interfaces in between. In accordance with some embodiments, the shielding structure is an integrated unit with no distinguishable interface therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a metal post over a first dielectric layer;
   attaching a second dielectric layer over the first dielectric layer;
   encapsulating a device die, the second dielectric layer, a shielding structure, and the metal post in an encapsulating material;
   planarizing the encapsulating material to reveal the device die, the shielding structure, and the metal post; and
   forming a first antenna electrically coupling to the device die, wherein the first antenna has a portion vertically aligned to a portion of the device die.

2. The method of claim 1 further comprising forming the shielding structure comprising:
   attaching a metal film over the second dielectric layer; and
   forming a side-shielding structure over the metal film, wherein the side-shielding structure and the metal film in combination form the shielding structure.

3. The method of claim 1 further comprising forming the shielding structure comprising:
   attaching a metal film over the second dielectric layer;
   after the encapsulating, forming an opening in the encapsulating material to reveal a portion of the metal film; and
   filling a conductive paste into the opening to form a side-shielding structure over the metal film, wherein the side-shielding structure and the metal film in combination form the shielding structure.

4. The method of claim 1 further comprising:
   pre-forming the shielding structure;
   attaching the device die to the shielding structure; and
   attaching the pre-formed shielding structure and the device die as an integrated unit over the second dielectric layer.

5. The method of claim 1 further comprising:
   spraying a conductive paste onto a surface and a sidewall of the device die to form the shielding structure; and
   attaching the shielding structure and the device die as an integrated unit over the second dielectric layer.

6. The method of claim 1 further comprising:
   forming a third dielectric layer, with the third dielectric layer and the device die being on opposite sides of the second dielectric layer; and
   forming a second antenna on the third dielectric layer, wherein the second antenna is electrically decoupled from the first antenna, and is configured to signally couple to the first antenna through electromagnetic field, and the first antenna and the second antenna in combination form a stacked patch antenna.

7. The method of claim 1 further comprising electrically grounding the shielding structure.

8. A method comprising:
   forming a first dielectric layer over a carrier;
   attaching a second dielectric layer to the first dielectric layer;
   disposing a metal film over the second dielectric layer;
   forming a side-shielding structure over the metal film;
   attaching a device die to the metal film, wherein the device die is in a region encircled by the side-shielding structure;
   encapsulating the device die and the side-shielding structure in an encapsulating material; and
   forming a first antenna, wherein the first antenna and the device die are on opposite sides of the second dielectric layer, and the first antenna is electrically coupled to the device die.

9. The method of claim 8 further comprising forming a plurality of redistribution lines, wherein the first antenna and the device die are further interconnected through the plurality of redistribution lines.

10. The method of claim 8 further comprising forming a metal post, wherein the encapsulating material encapsulates the metal post, and the first antenna and the device die are further interconnected through the metal post.

11. The method of claim 10, wherein the metal post and the side-shielding structure are formed sharing a common plating process.

12. The method of claim 8, wherein the forming the side-shielding structure comprises:
    depositing a metal seed layer over the first dielectric layer, the second dielectric layer, and the metal film, with the side-shielding structure formed starting from the metal seed layer; and
    removing portions of the metal seed layer, with remaining portions of the metal seed layer being parts of the side-shielding structure.

13. The method of claim 8, wherein a portion of the first antenna is vertically aligned with a portion of the device die.

14. The method of claim 8 further comprising:
    forming a third dielectric layer, with the third dielectric layer and the device die being on opposite sides of the second dielectric layer; and
    forming a second antenna on the third dielectric layer, wherein the second antenna is electrically decoupled from the first antenna, and the first antenna and the second antenna in combination form a stacked patch antenna.

15. A method comprising:
attaching a pre-formed dielectric layer over a carrier;
disposing a metal film over the pre-formed dielectric layer;
forming a side-shielding structure over and electrically coupling to the metal film, wherein the side-shielding structure forms a ring;
placing a device die in a region over the metal film, wherein the device die is encircled by the ring formed of the side-shielding structure;
encapsulating the device die and the side-shielding structure in an encapsulating material;
de-mounting the pre-formed dielectric layer, the device die, the metal film, and the side-shielding structure from the carrier; and
forming a first antenna, wherein the first antenna and the device die are on opposite sides of the pre-formed dielectric layer.

16. The method of claim 15, wherein the first antenna and the device die are electrically inter-coupled.

17. The method of claim 15 further comprising forming a metal post, wherein the encapsulating material encapsulates the metal post, and the first antenna and the device die are further interconnected through the metal post.

18. The method of claim 17 further comprising performing a planarization process on the encapsulating material to reveal both the metal post and the side-shielding structure.

19. The method of claim 17, wherein metal post and the side-shielding structure are formed in a common plating process.

20. The method of claim 15 further comprising:
forming an additional dielectric layer, with the additional dielectric layer and the device die being on opposite sides of the pre-formed dielectric layer; and
forming a second antenna on the additional dielectric layer, wherein the second antenna is electrically decoupled from the first antenna, and the first antenna and the second antenna in combination form a stacked patch antenna.

* * * * *